(12) United States Patent
Klein

(10) Patent No.: US 6,511,576 B2
(45) Date of Patent: Jan. 28, 2003

(54) SYSTEM FOR PLANARIZING MICROELECTRONIC SUBSTRATES HAVING APERTURES

(75) Inventor: Rita J. Klein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/929,296

(22) Filed: Aug. 13, 2001

(65) Prior Publication Data

US 2002/0068434 A1 Jun. 6, 2002

Related U.S. Application Data

(63) Continuation of application No. 09/441,923, filed on Nov. 17, 1999, now Pat. No. 6,306,768.

(51) Int. Cl.$^7$ ............................................... H01L 21/00
(52) U.S. Cl. .................... 156/345; 216/89; 438/693; 438/745
(58) Field of Search .................. 438/692, 693, 438/745; 156/345 LP; 216/38, 88, 89

(56) References Cited

U.S. PATENT DOCUMENTS

| | | |
|---|---|---|
| 5,020,283 A | 6/1991 | Tuttle |
| 5,069,002 A | 12/1991 | Sandhu et al. |
| 5,081,796 A | 1/1992 | Schultz |
| 5,177,908 A | 1/1993 | Tuttle |
| 5,209,816 A | 5/1993 | Yu et al. |
| 5,225,034 A | 7/1993 | Yu et al. |
| 5,232,875 A | 8/1993 | Tuttle et al. |
| 5,234,867 A | 8/1993 | Schultz et al. |
| 5,240,552 A | 8/1993 | Yu et al. |

(List continued on next page.)

FOREIGN PATENT DOCUMENTS

| | | |
|---|---|---|
| EP | 838845 A1 | 4/1998 |
| WO | WO 98/48453 | 10/1998 |

OTHER PUBLICATIONS

Cleaner Slurries, Fewer Wafer Defects; High Tech Separations News, v 11, n 4, p N/A; Sep. 1, 1998; ISSN: 1046–039X; Article.
Constance C. Knight; No Klebosol, No Chip; Clariant 2/99 Exactly your chemistry; Article.
Rodel Web Pages; Klebosol Slurries 1501–50.

*Primary Examiner*—William A. Powell
(74) *Attorney, Agent, or Firm*—Perkins Coie LLP

(57) ABSTRACT

A method for planarizing a microelectronic substrate. In one embodiment, the microelectronic substrate includes an insulating portion having at least one aperture that is empty or at least partially filled with a sacrificial material. The method can include pressing a planarizing medium having small abrasive elements against the microelectronic substrate and moving at least one of the microelectronic substrate and the planarizing medium relative to the other to remove material from the microelectronic substrate. In one aspect of the invention, the abrasive elements can include flumed silica particles having a mean cross-sectional dimension of less than about 200 nanometers and/or colloidal particles having a mean cross-sectional dimension of less than about fifty nanometers. The smaller abrasive elements can reduce formation of cracks or other defects in the insulating material during planarization to improve the reliability and performance of the microelectronic device.

27 Claims, 5 Drawing Sheets

U.S. PATENT DOCUMENTS

| | | |
|---|---|---|
| 5,244,534 A | 9/1993 | Yu et al. |
| 5,245,790 A | 9/1993 | Jerbic |
| 5,245,796 A | 9/1993 | Miller et al. |
| RE34,425 E | 11/1993 | Schultz |
| 5,270,241 A | 12/1993 | Dennison et al. |
| 5,297,364 A | 3/1994 | Tuttle |
| 5,354,490 A | 10/1994 | Yu et al. |
| 5,421,769 A | 6/1995 | Schultz et al. |
| 5,433,651 A | 7/1995 | Lustig et al. |
| 5,449,314 A | 9/1995 | Meikle et al. |
| 5,486,129 A | 1/1996 | Sandhu et al. |
| 5,514,245 A | 5/1996 | Doan et al. |
| 5,533,924 A | 7/1996 | Stroupe et al. |
| 5,540,810 A | 7/1996 | Sandhu et al. |
| 5,609,718 A | 3/1997 | Meikle |
| 5,618,381 A | 4/1997 | Doan et al. |
| 5,618,447 A | 4/1997 | Sandhu |
| 5,624,303 A | 4/1997 | Robinson |
| 5,643,060 A | 7/1997 | Sandhu et al. |
| 5,658,183 A | 8/1997 | Sandhu et al. |
| 5,658,190 A | 8/1997 | Wright et al. |
| 5,664,988 A | 9/1997 | Stroupe et al. |
| 5,679,065 A | 10/1997 | Henderson |
| 5,681,423 A | 10/1997 | Sandhu et al. |
| 5,690,540 A | 11/1997 | Elliott et al. |
| 5,700,180 A | 12/1997 | Sandhu et al. |
| 5,702,292 A | 12/1997 | Brunelli et al. |
| 5,730,642 A | 3/1998 | Sandhu et al. |
| 5,733,176 A | 3/1998 | Robinson et al. |
| 5,736,427 A | 4/1998 | Henderson |
| 5,747,386 A | 5/1998 | Moore |
| 5,792,709 A | 8/1998 | Robinson et al. |
| 5,795,218 A | 8/1998 | Doan et al. |
| 5,795,495 A | 8/1998 | Meikle |
| 5,801,066 A | 9/1998 | Meikle |
| 5,823,855 A | 10/1998 | Robinson |
| 5,827,781 A | 10/1998 | Skrovan et al. |
| 5,830,806 A | 11/1998 | Hudson et al. |
| 5,842,909 A | 12/1998 | Sandhu et al. |
| 5,851,135 A | 12/1998 | Sandhu et al. |
| 5,868,896 A | 2/1999 | Robinson et al. |
| 5,871,392 A | 2/1999 | Meikle et al. |
| 5,879,222 A | 3/1999 | Robinson |
| 5,882,248 A | 3/1999 | Wright et al. |
| 5,893,754 A | 4/1999 | Robinson et al. |
| 5,895,550 A | 4/1999 | Andeas |
| 5,910,043 A | 6/1999 | Manzonie et al. |
| 5,916,453 A | 6/1999 | Beilin et al. |
| 5,916,819 A | 6/1999 | Skrovan et al. |
| 5,919,082 A | 7/1999 | Walker et al. |
| 5,934,980 A | 8/1999 | Koos et al. |
| 5,938,801 A | 8/1999 | Wright |
| 5,954,912 A | 9/1999 | Moore |
| 5,967,030 A | 10/1999 | Blalock |
| 5,972,792 A | 10/1999 | Hudson |
| 5,976,000 A | 11/1999 | Hudson |
| 5,980,363 A | 11/1999 | Meikle et val. |
| 5,981,396 A | 11/1999 | Robinson et al. |
| 5,989,470 A | 11/1999 | Doan et al. |
| 5,990,012 A | 11/1999 | Robinson et al. |
| 5,994,224 A | 11/1999 | Sandhu et al. |
| 5,997,384 A | 12/1999 | Blalock |
| 6,036,586 A | 3/2000 | Ward |
| 6,039,633 A | 3/2000 | Chopra |
| 6,040,245 A | 3/2000 | Sandhu et al. |
| 6,046,111 A | 4/2000 | Robinson |
| 6,054,015 A | 4/2000 | Brunelli et al. |
| 6,060,395 A | 5/2000 | Skrovan et al. |
| 6,062,958 A | 5/2000 | Wright et al. |
| 6,074,286 A | 6/2000 | Ball |
| 6,077,785 A | 6/2000 | Andreas |
| 6,083,085 A | 7/2000 | Lankford |
| 6,090,475 A | 7/2000 | Robinson et al. |
| 6,110,820 A | 8/2000 | Sandhu et al. |
| 6,116,988 A | 9/2000 | Ball |
| 6,120,354 A | 9/2000 | Koos et al. |
| 6,124,207 A | 9/2000 | Robinson et al. |
| 6,135,856 A | 10/2000 | Tjaden et al. |
| 6,136,043 A | 10/2000 | Robinson et la. |
| 6,136,218 A | 10/2000 | Skrovan et al. |
| 6,139,402 A | 10/2000 | Moore |
| 6,143,123 A | 11/2000 | Robinson et al. |
| 6,152,808 A | 11/2000 | Moore |
| 6,176,763 B1 | 1/2001 | Kramer et al. |
| 6,180,525 B1 | 1/2001 | Morgan |
| 6,186,870 B1 | 2/2001 | Wright et al. |
| 6,187,681 B1 | 2/2001 | Moore |
| 6,191,037 B1 | 2/2001 | Robinson et al. |
| 6,193,588 B1 | 2/2001 | Carlson et al. |
| 6,196,899 B1 | 3/2001 | Chopra et al. |
| 6,200,901 B1 | 3/2001 | Hudson et al. |
| 6,203,404 B1 | 3/2001 | Joslyn et al. |
| 6,203,407 B1 | 3/2001 | Robinson |
| 6,203,413 B1 | 3/2001 | Skrovan |
| 6,206,754 B1 | 3/2001 | Moore |
| 6,206,756 B1 | 3/2001 | Chopra et al. |
| 6,206,757 B1 | 3/2001 | Custer et al. |
| 6,206,759 B1 | 3/2001 | Agarwal et al. |
| 6,210,257 B1 | 4/2001 | Carlson |
| 6,213,845 B1 | 4/2001 | Elledge |
| 6,218,316 B1 | 4/2001 | Marsh |
| 6,220,934 B1 | 4/2001 | Sharples et al. |
| 6,224,466 B1 | 5/2001 | Walker |
| 6,227,955 B1 | 5/2001 | Custer et al. |
| 6,234,874 B1 | 5/2001 | Ball |
| 6,234,877 B1 | 5/2001 | Koos et al. |
| 6,234,878 B1 | 5/2001 | Moore |
| 6,237,483 B1 | 5/2001 | Blalock |
| 6,244,944 B1 | 6/2001 | Elledge |
| 6,250,994 B1 | 6/2001 | Chopra et al. |
| 6,251,785 B1 | 6/2001 | Wright |
| 6,254,460 B1 | 7/2001 | Walker et al. |
| 6,261,151 B1 | 7/2001 | Sandhu et al. |
| 6,261,163 B1 | 7/2001 | Walker et al. |
| 6,267,650 B1 | 7/2001 | Hembree |
| 6,271,139 B1 | 8/2001 | Alwan et al. |
| 6,273,786 B1 | 8/2001 | Chopra et al. |
| 6,273,796 B1 | 8/2001 | Moore |
| 6,273,800 B1 | 8/2001 | Walker et al. |
| 6,276,996 B1 | 8/2001 | Chopra |
| 6,277,015 B1 | 8/2001 | Robinson et al. |
| 6,284,660 B1 | 9/2001 | Doan |
| 6,290,579 B1 | 9/2001 | Walker et al. |
| 6,296,557 B1 | 10/2001 | Walker |
| 6,306,012 B1 | 10/2001 | Sabde |
| 6,306,014 B1 | 10/2001 | Walker et al. |
| 6,306,768 B1 | 10/2001 | Klein |
| 6,309,282 B1 | 10/2001 | Wright et al. |
| 6,312,486 B1 | 11/2001 | Sandhu et al. |
| 6,312,558 B2 | 11/2001 | Moore |
| 6,313,038 B1 | 11/2001 | Chopra et al. |
| 6,325,702 B2 | 12/2001 | Robinson |
| 6,328,632 B1 | 12/2001 | Chopra |
| 6,331,135 B1 | 12/2001 | Sabde et al. |
| 6,331,139 B2 | 12/2001 | Walker et al. |
| 6,331,488 B1 | 12/2001 | Doan et al. |
| 6,338,667 B2 | 1/2002 | Sandhu et al. |
| 6,350,180 B2 | 2/2002 | Southwick |
| 6,350,691 B1 | 2/2002 | Lankford |
| 6,352,466 B1 | 3/2002 | Moore |
| 6,354,917 B1 | 3/2002 | Ball |

| | | |
|---|---|---|
| 6,354,919 B2 | 3/2002 | Chopra |
| 6,354,923 B1 | 3/2002 | Lankford |
| 6,354,930 B1 | 3/2002 | Moore |
| 6,358,122 B1 | 3/2002 | Sabde |
| 6,358,127 B1 | 3/2002 | Carlson et al. |
| 6,358,129 B2 | 3/2002 | Dow |
| 6,361,400 B2 | 3/2002 | Southwick |
| 6,361,417 B2 | 3/2002 | Walker et al. |
| 6,361,832 B1 | 3/2002 | Agarwal et al. |
| 6,364,749 B1 | 4/2002 | Walker |
| 6,364,757 B2 | 4/2002 | Moore |
| 6,368,193 B1 | 4/2002 | Carlson et al. |
| 6,368,194 B1 | 4/2002 | Sharples et al |
| 6,368,197 B2 | 4/2002 | Elledge |
| 6,375,548 B1 | 4/2002 | Andreas |
| 6,376,381 B1 | 4/2002 | Andreas |

SYSTEM FOR PLANARIZING MICROELECTRONIC SUBSTRATES HAVING APERTURES

CROSS-REFERENCE TO RELATED APPLICATION

This application is a continuation of U.S. patent application Ser. No. 09/441,923, filed on Nov. 17, 1999, now issued as U.S. Pat. No. 6,306,768.

TECHNICAL FIELD

This invention relates to methods for planarizing microelectronic substrates; for example, microelectronic substrates having dielectric portions with apertures that support devices such as capacitors.

BACKGROUND

Mechanical and chemical-mechanical planarization processes ("CMP") are used in the manufacturing of electronic devices for forming a flat surface on semi conductor wafers, field emission displays and many other microelectronic-device substrate assemblies. CMP processes generally remove material from a substrate assembly to create a highly planar surface at a precise elevation in the layers of material on the substrate assembly. FIG. 1 schematically illustrates an existing web-format planarizing machine 10 for planarizing a substrate 12. The planarizing machine 10 has a support table 14 with a top-panel 16 at a workstation where an operative portion (A) of a planarizing pad 40 is positioned. The top-panel 16 is generally a rigid plate to provide a flat, solid surface to which a particular section of the planarizing pad 40 may be secured during planarization.

The planarizing machine 10 also has a plurality of rollers to guide, position and hold the planarizing pad 40 over the top-panel 16. The rollers include a supply roller 20, first and second idler rollers 21a and 21b, first and second guide rollers 22a and 22b, and take-up roller 23. The supply roller 20 carries an unused or pre-operative portion of the planarizing pad 40, and the take-up roller 23 carries a used or post-operative portion of the planarizing pad 40. Additionally, the first idler roller 21a and the first guide roller 22a stretch the planarizing pad 40 over the top-panel 16 to hold the planarizing pad 40 stationary during operation. A motor (not shown) drives at least one of the supply roller 20 and the take-up roller 23 to sequentially advance the planarizing pad 40 across the top-panel 16. Accordingly, clean pre-operative sections of the planarizing pad 40 may be quickly substituted for used sections to provide a consistent surface for planarizing and/or cleaning the substrate 12.

The web-format planarizing machine 10 also has a carrier assembly 30 that controls and protects the substrate 12 during planarization. The carrier assembly 30 generally has a substrate holder 32 to pick up, hold and release the substrate 12 at appropriate stages of the planarizing process. Several nozzles 33 attached to the substrate holder 32 dispense a planarizing solution 44 onto a planarizing surface 42 of the planarizing pad 40. The carrier assembly 30 also generally has a support gantry 34 carrying a drive assembly 35 that translates along the gantry 34. The drive assembly 35 generally has an actuator 36, a drive shaft 37 coupled to the actuator 36, and an arm 38 projecting from the drive shaft 37. The arm 38 carries the substrate holder 32 via a terminal shaft 39 such that the drive assembly 35 orbits the substrate holder 32 about an axis B—B (as indicated by arrow $R_1$).

The drive assembly 35 can also rotate the substrate holder 32 about its central axis C—C (as indicated by arrow $R_2$).

The planarizing pad 40 and the planarizing solution 44 define a planarizing medium that mechanically and/or chemically-mechanically removes material from the surface of the substrate 12. The planarizing pad 40 used in the web-format planarizing machine 10 is typically a fixed-abrasive planarizing pad in which abrasive particles are fixedly bonded to a suspension material. In fixed-abrasive applications, the planarizing solution is a "clean solution" without abrasive particles because the abrasive particles are fixedly distributed across the planarizing surface 42 of the planarizing pad 40. In other applications, the planarizing pad 40 may be a non-abrasive pad without abrasive particles, composed of a polymeric material (e.g., polyurethane) or other suitable materials. The planarizing solutions 44 used with the non-abrasive planarizing pads are typically CMP slurries with abrasive particles and chemicals to remove material from a substrate. Typical abrasive particles include ILD 1300 fumed silica particles, available from Rodel, Inc. of Wilmington, Del. and having a mean cross-sectional dimension of 200 nanometers, or Klebosol 1508-50 colloidal particles, also available from Rodel, Inc. and having a mean cross-sectional dimension of fifty nanometers.

To planarize the substrate 12 with the planarizing machine 10, the carrier assembly 30 presses the substrate 12 against the planarizing surface 42 of the planarizing pad 40 in the presence of the planarizing solution 44. The drive assembly 35 then orbits the substrate holder 32 about the axis B—B and/or rotates the substrate holder 32 about the axis C—C to translate the substrate 12 across the planarizing surface 42. As a result, the abrasive particles and/or the chemicals in the planarizing medium remove material from the surface of the substrate 12.

The CMP processes should consistently and accurately produce a uniformly planar surface on the substrate assembly to enable precise fabrication of circuits and photo-patterns. During the fabrication of transistors, contacts, interconnects and other features, many substrate assemblies develop large "step heights" that create a highly topographic surface across the substrate assembly. Yet, as the density of integrated circuits increases, it is necessary to have a planar substrate surface at several intermediate processing stages because non-uniform substrate surfaces significantly increase the difficulty of forming sub-micron features. For example, it is difficult to accurately focus photo patterns to within tolerances approaching 0.1 micron on non-uniform substrate surfaces because sub-micron photolithographic equipment generally has a very limited depth of field. Thus, CMP processes are often used to transform a topographical substrate surface into a highly uniform, planar substrate surface.

During one conventional process, capacitors and other electrical components are formed in the microelectronic substrate 12 by first forming an aperture in the substrate 12 and then depositing successive layers of conductive and dielectric materials into the aperture. For example, FIG. 2A is a cross-sectional view of a portion of the substrate 12 shown in FIG. 1. The substrate 12 includes a base dielectric material 50 having two capacitor apertures 51. The walls of the capacitor apertures 51 are initially coated with a first conductive layer 60 that extends between the adjacent apertures. The substrate 12 is then planarized, using a process such as that discussed above with reference to FIG. 1, to remove intermediate portions 56 from between the capacitor apertures 51. Accordingly, the remaining portions of the conductive layer 60 within each capacitor aperture 51 are electrically isolated from each other.

As shown in FIG. 2B, a layer of dielectric material 61 is deposited on the remaining portions of the conductive layer 60 and on the exposed portions of the substrate upper surface 54. A second conductive layer 62 is deposited on the dielectric material 61 to form capacitors 70. An insulating material 63, such as borophosphate silicon glass (BPSG) is disposed on the second conductive layer 62 to fill the remaining space in the capacitor apertures 51 and electrically insulate the capacitors 70 from additional structures subsequently formed on the substrate 12. After the capacitors 70 are formed, a conductive plug aperture 52 is etched into the substrate 12 and filled with a conductive material to provide a conductive path between layers of the substrate 12.

One potential problem with the conventional method described above with reference to FIGS. 1–2B is that the base dielectric material 50 can crack during the planarization process. For example, the base dielectric material 50 typically includes an oxide or glass, such as silicon dioxide or BPSG, both of which are generally brittle. As the intermediate portions 56 are removed from between adjacent capacitor apertures 51, cracks 53 may form in the base dielectric material 50 between the adjacent capacitor apertures 51 at or beneath the substrate upper surface 54. Alternatively, the cracks 53 may extend from one or more of the capacitor apertures 51 to the conductive plug aperture 52. In either case, when the substrate 12 is heated during subsequent processing steps, the first conductive layer 60 may soften and flow through the cracks 53, potentially forming short circuits between neighboring capacitors 70 or between the capacitors 70 and the conductive plug formed in the plug aperture 52. These short circuits can substantially impair the performance of the resulting microelectronic device.

SUMMARY OF THE INVENTION

The present invention is directed toward methods for planarizing microelectronic substrates. One such method includes engaging a planarizing medium with a microelectronic substrate at least proximate to an insulating portion of the microelectronic substrate having an aperture that is empty or at least partially filled with a sacrificial material. The method can further include supplying the planarizing medium with relatively small abrasive elements. For example, the abrasive elements can include colloidal particles with a mean cross-sectional dimension of less than approximately fifty nanometers or fumed silica particles with a mean cross-sectional dimension of less than approximately 200 nanometers. The method can further include moving at least one of the microelectronic substrate and the planarizing medium relative to the other to remove material from the microelectronic substrate.

In one particular aspect of the invention, the microelectronic substrate can include a plurality of apertures, and capacitors can be formed in the apertures by successively disposing a first conductive layer, a dielectric layer, and a second conductive layer in the apertures. Accordingly, planarizing the microelectronic substrate can include planarizing the first conductive layer to electrically isolate portions of the first conductive layer within adjacent apertures from each other. In a further aspect of this embodiment, adjacent apertures are separated by a wall thickness of about 0.10 micron or less. The apertures can be filled with a non-structural, non-supporting material (such as a photoresistant gel) during planarization to restrict material from entering the apertures.

DETAILED DESCRIPTION OF THE INVENTION

The present disclosure describes methods for planarizing substrate assemblies used in the fabrication of microelectronic devices. Many specific details of certain embodiments of the invention are set forth in the following description and in FIGS. 3–7 to provide a thorough understanding of these embodiments. One skilled in the art, however, will understand that the present invention may have additional embodiments, and the invention may be practiced without several of the details described in the following description.

Figure 3:
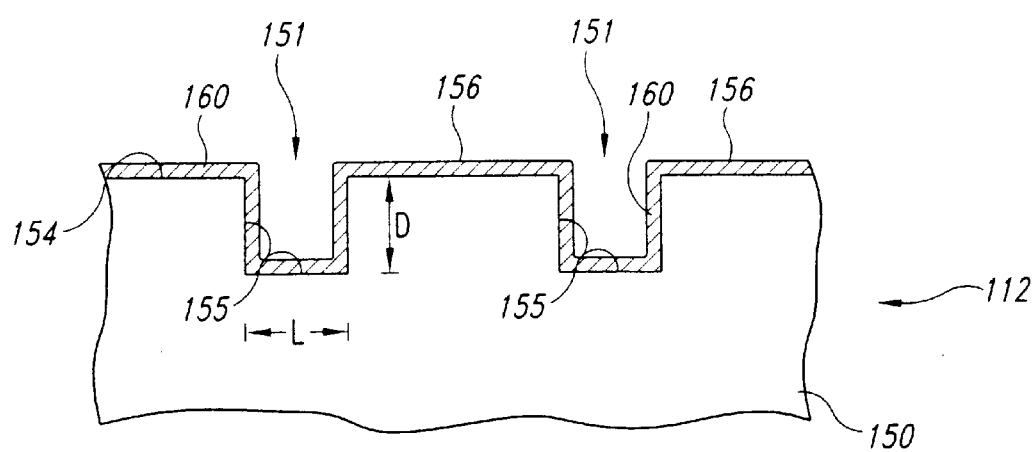
FIG. 3 is a partially schematic, side elevational view of a substrate having capacitor apertures for forming capacitors in accordance with an embodiment of the present invention.

FIG. 3 is a schematic cross-sectional view of a portion of a microelectronic substrate 112 that includes a base dielectric material 150 having a plurality of capacitor apertures 151 in which capacitors are formed. In one embodiment, the base dielectric material 150 can be a glass or glass-like material, such as silicon dioxide or BPSG. Alternatively, the base dielectric material 150 can be other insulating materials, such as tetraethyl-orthosilicate (TEOS), oxides or other doped or undoped insulating materials. Accordingly, the base dielectric material 150 can provide an electrically non-conductive support for capacitors and other electrical components or circuit elements.

In one embodiment, the capacitor apertures 151 can have a depth D of from about one micron to about three microns and in a specific aspect of this embodiment, the depth can be about 1.4 microns. In a further aspect of this embodiment, the capacitor apertures 151 can have a generally triangular or pear-shaped cross-sectional shape when intersected by a plane parallel to an upper surface 154 of the base dielectric material 150. For example, a short side of the triangular cross-sectional shape can have a length of about 0.25 micron or less and a long side L can have a length of about 0.30 micron or less. Alternatively, the capacitor apertures 151 can have other dimensions and shapes that can support the formation of capacitors in the manner discussed below.

As shown in FIG. 3, a first conductive material 160 is deposited on the microelectronic substrate 112 to form a layer that covers the upper surface 154 of the base dielectric material 150 and walls 155 of the capacitor apertures 151. In one embodiment, the first conductive material 160 includes polysilicon, such as hemispherical grain (HSG) polysilicon, doped with boron or phosphorus. Alternatively, the first conductive material 160 can include copper, platinum or other metals, metal alloys and/or non-metal conductive materials, such as ruthenium oxide. In either embodiment, the first conductive material 160 forms conductive connecting portions 156 extending between neighboring capacitor apertures 151. The connecting portions 156 are removed by a CMP process (as will be discussed in greater detail below with reference to FIG. 4) to electrically isolate the portions of the first conductive material 160 in each capacitor aperture 151.

Figure 1:
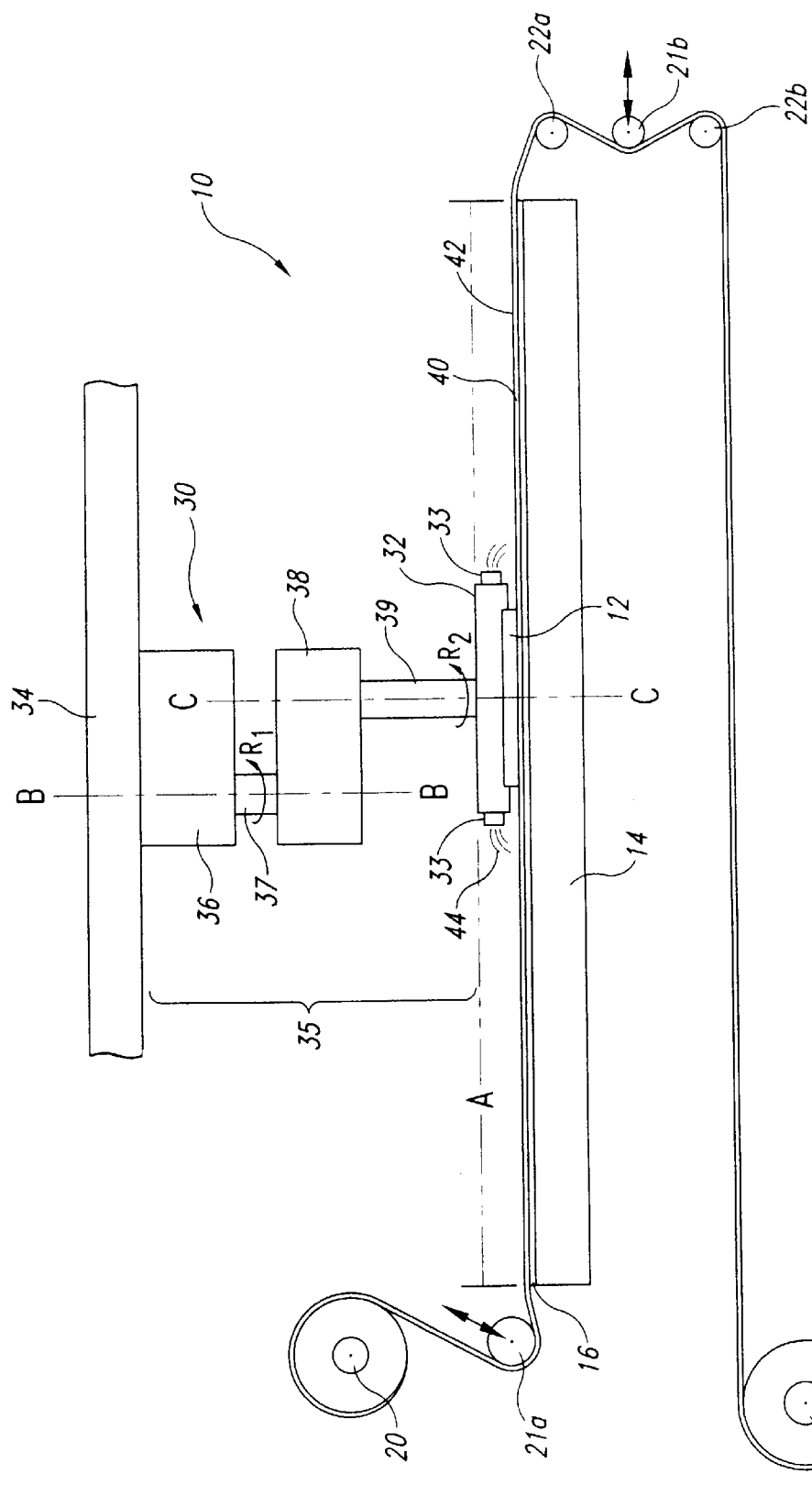
FIG. 1 is a partially schematic, side elevational view of a planarizing apparatus in accordance with the prior art.
Figure 2A:
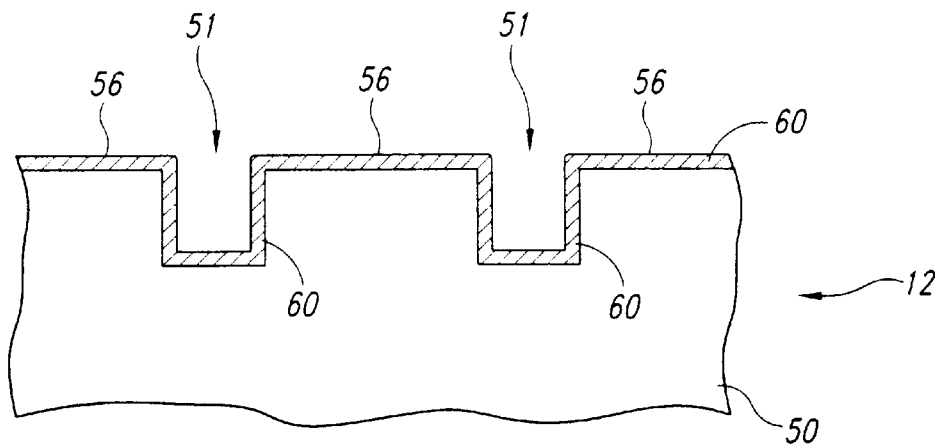
FIGS. 2A and 2B are partially schematic, side elevational views of a substrate having capacitors formed in a process in accordance with the prior art.
Figure 2B:
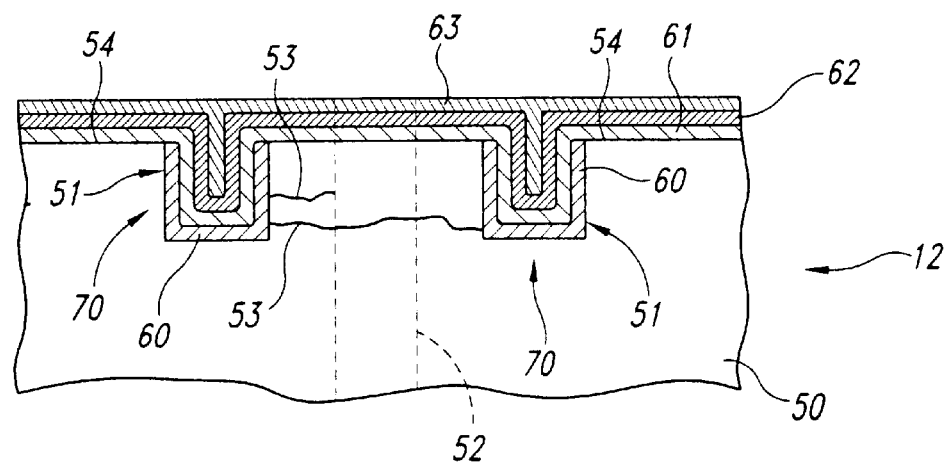
Figure 4:
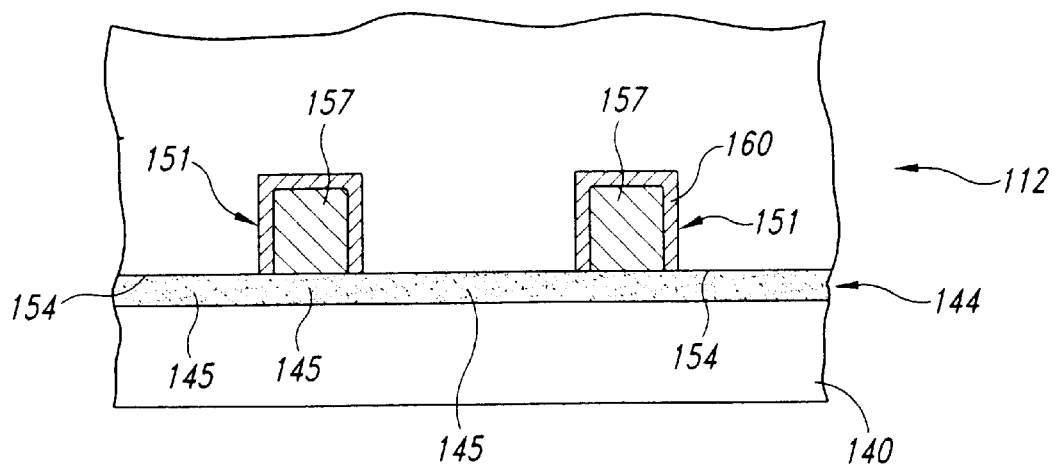
FIG. 4 is a partially schematic, side elevational view of the substrate shown in FIG. 3 undergoing a planarizing process in accordance with an embodiment of the invention.

FIG. 4 is a schematic, cross-sectional view of the portion of the microelectronic substrate 112 inverted from the orientation shown in FIG. 3 and placed against a planarizing medium that includes a planarizing pad 140 having a planarizing liquid 144 disposed thereon. The planarizing pad 140 can be a polyurethane-based pad, such as a URII or WWP3000 pad, available from Rodel, Inc. of Wilmington, Del. Alternatively, the planarizing pad 140 can include other suitable planarizing devices. The planarizing pad 140 can be positioned on a web-format machine, such as was discussed above with reference to FIG. 1, or other devices as will be discussed below with reference to FIG. 7.

Prior to planarizing the microelectronic substrate 112, the capacitor apertures 151 are filled with a sacrificial filler material 157 that restricts or prevents the planarizing liquid 144 and any material removed from the microelectronic substrate 112 from entering the capacitor apertures 151. In one embodiment, the filler material 157 is a fluid, flexible or pliable material that readily conforms to the shape of the capacitor apertures 151 and is relatively easy to remove after the planarizing process is complete. For example, the filler material 157 can be a commercially available photoresistant material in the form of a gel that can be removed with an etchant. In other embodiments, the filler material 157 can be other non-structural and/or non-rigid materials that similarly protect the capacitor apertures 151 from contamination during planarization and are removable after planarization.

During planarization, the planarizing liquid 144 is disposed on the planarizing pad 140, and the planarizing pad 140 and/or the microelectronic substrate 112 are moved relative to each other (in a manner generally similar to that discussed above with reference to FIG. 1). The planarizing liquid 144 and the planarizing pad 140 remove the connecting portions 156 (FIG. 3) positioned between the capacitor apertures 151 until the upper surface 154 of the base dielectric material 150 is exposed in the regions formerly covered by the connecting portions 156.

The planarizing liquid 144 generally includes a suspension of small abrasive particles 145 that engage the microelectronic substrate 112 during planarization to abrasively remove material from the microelectronic substrate 112. Alternatively, the planarizing pad 140 can include the abrasive particles, as will be discussed in greater detail below with reference to FIG. 7. In one embodiment, the abrasive particles 145 include generally rounded colloidal particles having a mean cross-sectional dimension of less than about fifty nanometers. In a further aspect of this embodiment, the abrasive particles can have a mean cross-sectional dimension of about twelve nanometers or less. Planarizing liquids having colloidal particles with a mean cross-sectional dimension of twelve nanometers are available from Solution Technology, Inc., a subsidiary of Rodel, Inc. of Wilmington, Del. under the trade name Klebosol 1508-12.

In another embodiment, the abrasive particles 145 can include more irregularly shaped fumed silica particles having a mean cross-sectional dimension of less than about 200 nanometers. For example, the fumed silica particles can have a mean cross-sectional dimension of about 100 nanometers or less. Such abrasive particles are available from the Wacker Co. of Adrian, Mich. As used herein, the term "mean cross-sectional dimension" refers to the mean linear cross-sectional dimension of the average-sized abrasive particle 145 in the planarizing liquid 144. For example, when the abrasive particles 145 are generally round and uniformly sized, the mean cross-sectional dimension refers to the diameter of any of the abrasive particles. When the planarizing liquid 144 includes a distribution of abrasive particles 145 having irregular shapes and a variety of sizes, the mean cross-sectional dimension refers to the average linear cross-sectional dimension of the average particle in the distribution.

Figure 5:
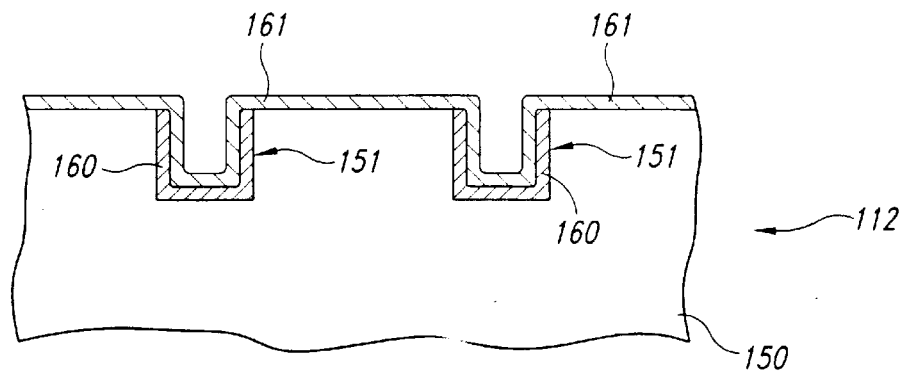
FIG. 5 is a partially schematic, side elevational view of the substrate shown in FIG. 4 having a dielectric layer deposited thereon.
Figure 6:
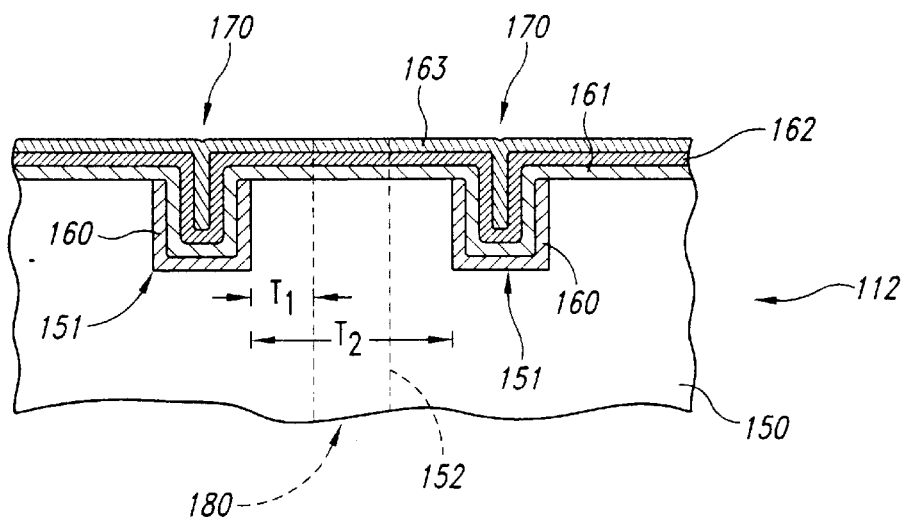
FIG. 6 is a partially schematic, side elevational view of the substrate shown in FIG. 5 having a conductive layer deposited on the dielectric layer.

FIG. 5 is a schematic cross-sectional view of the substrate assembly 112 after the connecting portions 156 have been removed. Once the planarization operation is complete, the filler material 157 (FIG. 4) is removed from the capacitor apertures 151 and the microelectronic substrate 112 is righted. A layer of dielectric material 161 is deposited on the microelectronic substrate 112 to cover the remaining portions of the first conductive material 160. The dielectric material 161 is then covered with a second conductive material 162, as shown in FIG. 6. The second conductive material 162, together with the first conductive material 160 and the dielectric material 161, form capacitors 170 in the capacitor apertures 151. An insulating material 163 is disposed on the second conductive material 162 to fill in the remaining volume of the capacitor apertures 151 and electrically isolate the capacitors 170 from conductive materials disposed on the microelectronic substrate 112 in subsequent operations.

After the capacitors 170 are formed, a plug aperture 152 is etched into the base dielectric material 150 and filled with a conductive material to provide a conductive plug 180 extending between components of the microelectronic substrate 112, for example, a transistor (not shown) positioned beneath the capacitors 170 and electrical contacts (not shown) positioned above the capacitors 170. In one aspect of this embodiment, the conductive plug aperture 152 is separated from the capacitor apertures 151 by a distance $T_1$ of about 0.14 micron or less, and adjacent capacitor apertures 151 are separated by a distance $T_2$ of about 0.15 micron or less. In another aspect of this embodiment, the distance $T_1$ can be about 0.10 micron or less and the distance $T_2$ can be about 0.125 micron or less. In still another aspect of this embodiment, six capacitor apertures 151 can be arranged in a ring around a single conductive plug aperture 152, with a diameter of the ring being about 0.4 micron. In other embodiments, the spacings between adjacent capacitor apertures 151 and/or between the capacitor apertures 151 and the conductive plug 180 can have other values that allow the apertures to be positioned closely together without causing the intermediate base dielectric material 150 to crack and to short-circuit the capacitors 170.

One feature of several embodiments of the abrasive particles 145 discussed above with reference to FIGS. 3–6 is that they are smaller than conventional abrasive particles used for planarizing microelectronic substrates having dielectric portions with apertures. For example, some conventional processes for planarizing such substrates include using fumed silica particles having a diameter of about 200 nanometers and larger or using colloidal particles having a diameter of about fifty nanometers and larger. An advantage of several embodiments of the abrasive particles 145 is that they are less likely to crack the base dielectric material 150 during planarization. Accordingly, planarizing with the abrasive particles 145 can reduce the likelihood for creating short circuits between neighboring capacitors 170, between the capacitors 170 and the conductive plug 180, and/or between the capacitors 170 and other conductive features of the microelectronic substrate 112. It is believed that the smaller abrasive particles 145 have a decreased tendency to crack the base dielectric material 150 because they exert less stress on the surface of the microelectronic substrate 112 during planarization than relatively larger particles.

Another effect of an embodiment of the smaller abrasive particles 145 is that they form a smoother surface on the microelectronic substrate 112 than larger conventional abrasive particles. The smoother surface can be advantageous because it can indicate that the base dielectric material 150 has fewer cracks. Accordingly, the quality of the microelectronic substrate 112 can be assessed without more invasive diagnostic techniques (such as cutting the microelectronic substrate 112 for visual examination), which can destroy the circuit elements of the microelectronic substrate 112. Furthermore, subsequent deposition and planarizing steps may be more accurately performed when the underlying planarized structure has a smoother supporting surface.

Figure 7:
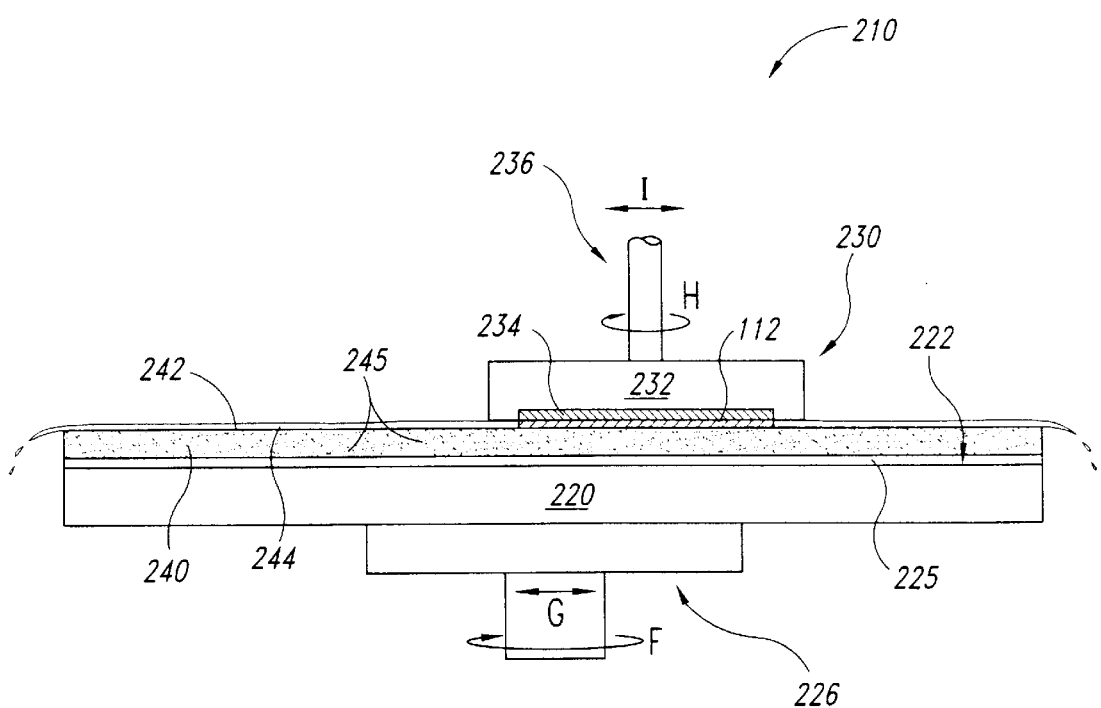
FIG. 7 is a partially schematic, side elevational view of an apparatus for planarizing a microelectronic substrate in accordance with another embodiment of the invention.

FIG. 7 is a schematic partial cross-sectional view of a rotary planarizing machine 210 with a generally circular platen or table 220, a carrier assembly 230, a planarizing pad 240 positioned on the table 220 and a planarizing fluid 244 on the planarizing pad 240. The planarizing machine 210 may also have an under-pad 225 attached to an upper surface 222 of the platen 220 for supporting the planarizing pad 240. A drive assembly 226 rotates (arrow F) and/or reciprocates (arrow G) the platen 220 to move the planarizing pad 240 during planarizing.

The carrier assembly 230 controls and protects the microelectronic substrate 112 during planarization. The carrier assembly 230 typically has a substrate holder 232 with a pad 234 that holds the microelectronic substrate 112 via suction. A drive assembly 236 of the carrier assembly 230 typically rotates and/or translates the substrate holder 232 (arrows H and I, respectively). Alternatively, the substrate holder 232 may include a weighted, free-floating disk (not shown) that slides over the planarizing pad 240.

The planarizing pad 240 can include abrasive particles 245 of the type discussed above with reference to FIGS. 3–6, fixedly dispersed in the planarizing pad adjacent to a planarizing surface 242 of the pad. To planarize the microelectronic substrate 112 with the planarizing machine 210, the carrier assembly 230 presses the microelectronic substrate 112 against the planarizing surface 242 of the planarizing pad 240. The platen 220 and/or the substrate holder 232 then move relative to one another to translate the microelectronic substrate 112 across the planarizing surface 242. As a result, the abrasive particles 245 in the planarizing pad 240 and/or the chemicals in the planarizing liquid 244 remove material from the surface of the microelectronic substrate 112.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A system for planarizing a microelectronic substrate, comprising:
    a planarizing medium having abrasive elements with a mean cross-sectional dimension of less than approximately fifty nanometers;
    a workpiece support positioned at least proximate to the planarizing medium, at least one of the workpiece support and the planarizing medium being movable relative to the other; and
    a microelectronic workpiece carried by the workpiece support, the microelectronic workpiece having an insulating portion including at least one aperture that is empty or contains a sacrificial material, the microelectronic workpiece being in contact with at least some of the abrasive elements of the planarizing medium.

2. The system of claim 1 wherein the aperture is a first aperture and wherein the microelectronic substrate includes a second aperture in the insulating portion with a wall thickness of about 0.15 micron between the first aperture and the second aperture.

3. The system of claim 1 wherein the aperture is a first aperture and wherein the microelectronic substrate includes a second aperture in the insulating portion.

4. The system of claim 1 wherein the aperture contains a non-rigid, sacrificial material.

5. The system of claim 1 wherein the aperture contains a non-rigid, sacrificial photoresist gel.

6. The system of claim 1 wherein the abrasive elements include colloidal abrasive elements having a mean cross-sectional dimension of approximately twelve nanometers.

7. The system of claim 1 wherein the microelectronic substrate includes a conductive material overlying the insulative material.

8. The system of claim 1 wherein the microelectronic substrate includes a doped polysilicon material overlying the insulative material.

9. The system of claim 1 wherein the microelectronic substrate includes platinum or another metal or metal alloy overlying the insulative material.

10. The system of claim 1 wherein the microelectronic substrate includes ruthenium oxide or another non-metal overlying the insulative material.

11. The system of claim 1 wherein the planarizing medium includes a planarizing pad and a planarizing liquid disposed on the planarizing pad, and wherein the abrasive elements are disposed in the planarizing liquid.

12. The system of claim 1 wherein the planarizing medium includes a planarizing pad and wherein the abrasive elements are fixedly disposed in the planarizing pad.

13. The system of claim 1 wherein the insulating portion includes an oxide.

14. The system of claim 1 wherein the aperture includes a capacitor aperture.

15. The system of claim 1 wherein the aperture includes an opening having a length along a first axis of approximately 0.30 micron or less and a width along a second axis transverse to the first axis of approximately 0.25 micron or less.

16. A system for planarizing a microelectronic substrate, comprising:
    a planarizing medium having abrasive elements, including fumed silica particles having a mean cross-sectional dimension of less than approximately 200 nanometers and/or colloidal particles having a mean cross-sectional dimension of less than approximately fifty nanometers;
    a workpiece support positioned at least proximate to the planarizing medium, at least one of the workpiece support and the planarizing medium being movable relative to the other; and
    a microelectronic workpiece carried by the workpiece support, the microelectronic workpiece having a dielectric portion including at least one aperture, the at least one aperture being empty or containing a sacrificial material, the microelectronic workpiece being in contact with at least some of the abrasive elements of the planarizing medium.

17. The system of claim 16 wherein the at least one aperture contains a non-rigid sacrificial material.

18. The system of claim 16 wherein the at least one aperture contains a non-rigid, sacrificial photoresist gel.

19. The system of claim 16 wherein the abrasive elements include colloidal abrasive elements having a mean cross-sectional dimension of approximately twelve nanometers.

20. The system of claim 16 wherein the planarizing medium includes a planarizing pad and a planarizing liquid disposed on the planarizing pad, and wherein the abrasive elements are disposed in the planarizing liquid.

21. The system of claim 16 wherein the planarizing medium includes a planarizing pad and wherein the abrasive elements are fixedly disposed in the planarizing pad.

22. A system for planarizing a microelectronic substrate, comprising:
   a planarizing medium having abrasive elements, including fumed silica particles having a mean cross-sectional dimension of less than approximately 200 nanometers and/or colloidal particles having a mean cross-sectional dimension of less than approximately fifty nanometers;
   a workpiece support positioned at least proximate to the planarizing medium, at least one of the workpiece support and the planarizing medium being movable relative to the other; and
   a microelectronic workpiece carried by the workpiece support, the microelectronic workpiece having a dielectric portion including a first aperture and a second aperture spaced apart from the first aperture by a distance of about 0.15 micron or less, the first and second apertures being empty or containing a sacrificial material, the microelectronic workpiece being in contact with at least some of the abrasive elements of the planarizing medium.

23. The system of claim 22 wherein the first and second apertures contain a non-rigid, sacrificial material.

24. The system of claim 22 wherein the first and second apertures contain a non-rigid, sacrificial photoresist gel.

25. The system of claim 22 wherein the abrasive elements include colloidal abrasive elements having a mean cross-sectional dimension of approximately twelve nanometers.

26. The system of claim 22 wherein the planarizing medium includes a planarizing pad and a planarizing liquid disposed on the planarizing pad, and wherein the abrasive elements are disposed in the planarizing liquid.

27. The system of claim 22 wherein the planarizing medium includes a planarizing pad and wherein the abrasive elements are fixedly disposed in the planarizing pad.

* * * * *

UNITED STATES PATENT AND TRADEMARK OFFICE
CERTIFICATE OF CORRECTION

PATENT NO. : 6,511,576 B2
DATED : January 28, 2003
INVENTOR(S) : Klein

It is certified that error appears in the above-identified patent and that said Letters Patent is hereby corrected as shown below:

<u>Title page,</u>
Item [57] ABSTRACT,
Line 10, "flumed" should be -- fumed --;
Lines 14-15, insert -- the -- between "reduce" and "formation";

<u>Column 9,</u>
Line 4, insert comma between "non-rigid" and "sacrificial".

Signed and Sealed this

Twenty-ninth Day of July, 2003

JAMES E. ROGAN
*Director of the United States Patent and Trademark Office*